(12) United States Patent
Cho et al.

(10) Patent No.: US 6,734,085 B1
(45) Date of Patent: May 11, 2004

(54) ANTI-TYPE DOSAGE AS LDD IMPLANT

(75) Inventors: Shu-Ying Cho, Hsin-Chu (TW);
Chien-Chung Wang, Hsin-Chu (TW);
Chien-Ming Chung, Hsin-Chu (TW);
Yuan-Chang Huang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/307,676

(22) Filed: Dec. 2, 2002

(51) Int. Cl.⁷ .............................................. H01L 21/425
(52) U.S. Cl. ...................................................... 438/514
(58) Field of Search ........................ 438/514, 515–517, 438/525–538, 555

(56) References Cited

U.S. PATENT DOCUMENTS

| | | | |
|---|---|---|---|
| 5,480,822 A | 1/1996 | Hsue et al. ................... 437/48 |
| 5,538,914 A | * 7/1996 | Chiu et al. ................... 438/275 |
| 5,940,710 A | 8/1999 | Chung et al. ................ 438/305 |
| 6,087,699 A | * 7/2000 | Wann et al. .................. 257/384 |
| 6,133,101 A | 10/2000 | Wu ............................ 438/276 |

\* cited by examiner

*Primary Examiner*—Craig A. Thompson
(74) *Attorney, Agent, or Firm*—George O. Saile; Stephen B. Ackerman; Douglas R. Schnabel

(57) ABSTRACT

A method is provided for turning off MOS transistors through an anti-code (type) LDD implant without the need for high energy implant that causes poly damage. The method also negates any deleterious effects due to the variations in the thickness of the poly gate. The anti-code LDD implant can be performed vertically, or at a tilt angle, or in a combination of vertical and tilt angle. The method can be made part of a Flash-ROM process that is applicable to both polycide and silicide processes.

36 Claims, 3 Drawing Sheets

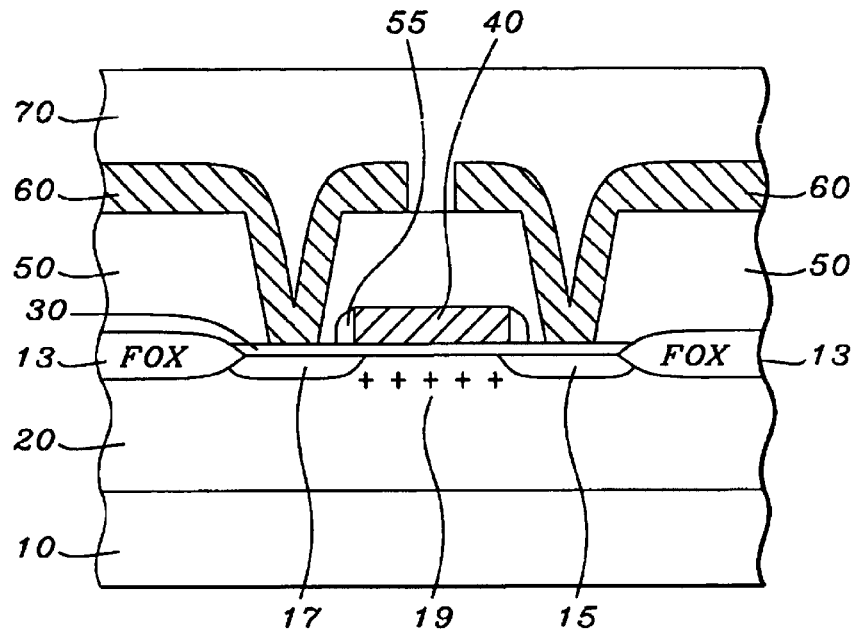
FIG. 1 – Prior Art
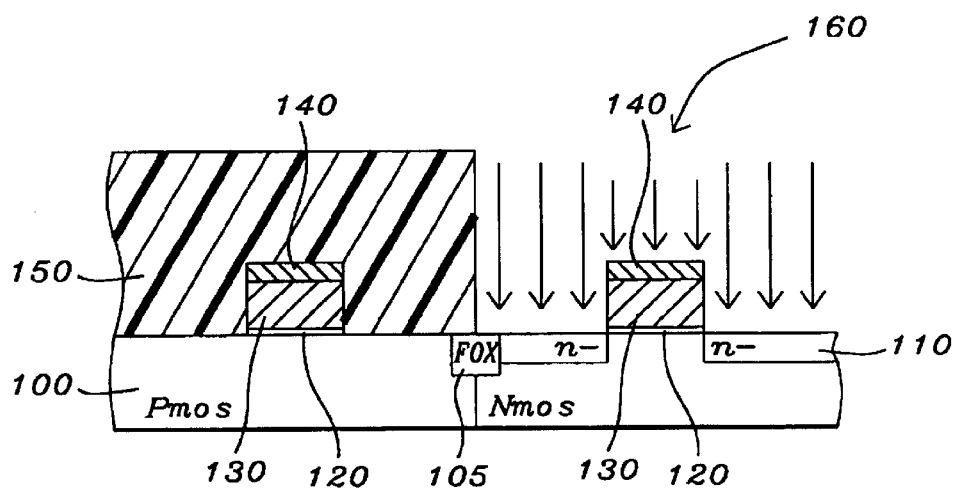
FIG. 2a

ANTI-TYPE DOSAGE AS LDD IMPLANT

BACKGROUND OF THE INVENTION (1) Field of the Invention

The present invention relates to semiconductor manufacturing and is more particularly directed to coding ROM (Read Only Memory) products to reduce mask cost and shorten product cycle time.

(2) Description of the Related Art

Nonvolatile read only memories or, ROMS, are programmed word by word (i.e., eight bits, or one byte, at a time) in contrast to random access memories, or RAMS, which are programmed one bit at a time. The first group of nonvolatile memories consists of those ROMs in which data is entered during manufacturing, and cannot subsequently be altered by the user. These devices are known as masked ROMs (or simply ROMS). The next category consists of memories which data can be entered by the user (user-programmable ROMS). In the first example of this type, known as programmable ROM, or PROM, data can be entered into the device only once. In the remaining ROM types, data can be erased as well as erased. In one class of erasable ROMS, the cells must be exposed to a strong ultraviolet light in order for stored data to be erased. These ROMs are called erasable-programmable ROMS, or EPROMs. In the final type, data can be electrically erased as well as entered into the device, these are referred to as EEPROMs.

Typically, masked ROM, or ROM, includes at least two types of devices with different threshold voltages in a wafer. A type of device is formed in an active area and another type of device with a threshold voltage mask formed in another active area during the process. For example, the first device is a normal device with threshold voltage $V_{t1}$ and another device with a threshold voltage $V_{t2}$, wherein the $V_{t1}$ is different from $V_{t2}$. Therefore, the second device needs an extra mask for ion implantation to obtain a different threshold voltage as provided with the first device. The method involves differentiating the threshold voltages by ion implantation of some of the transistor to different levels of threshold voltage. This method raises the threshold voltage of the n-channel device by doping boron with heavy dose. This method is so called threshold voltage programming. There are also the well known methods of field oxide programming and through-hole programming. The former method is introduced during manufacturing by using oxides of different thicknesses to differentiate between the different threshold voltages of the devices. In another method, the programming is achieved by selectively opening the contacts to the cells for the corresponding transistors and drains.

FIG. 1 is a cross-sectional view of a programmed cell for a typical prior art ROM device fabricated by the threshold voltage implant method. The threshold voltage implant method changes an enhancement mode n-channel metal oxide semiconductor field effect transistor (MOSFET) into a depletion mode device by implanting n-type ions into the channel region of the MOS transistor. The n-type implant programs or codes the transistor of the cell. In the present invention, however, p-type code is used for an enhancement mode n-channel MOS for the ROM process that is disclosed later in the embodiments of the invention.

The programmed cell shown in FIG. 1 includes a depletion mode MOS transistor in a semiconductor substrate (10). The programmed cell defines a p-type well region (20), field oxide regions (13), gate oxide region (30), and source/drain regions (15), (17). The programmed cell also defines an implanted channel region (19) under the gate oxide region (30). The implanted channel region changes the enhancement mode MOS transistor into the depletion mode transistor. A polysilicon gate (40), gate sidewall spacers (55), borophosphosilicate glass layer (50) (BPSG), metallization layer (60), and surface passivation (70) are also shown. The polysilicon gate, source region, drain region, and channel region define the depletion mode MOS-FET.

Each cell, such as the cell of FIG. 1, corresponds to a region for storing bits of information in a ROM semiconductor integrated circuit chip. Thousands and even millions of these microscopically small regions make up a core memory area (or active cell area) of the ROM chip. The completed ROM chip also includes peripheral circuits, interconnects, and bonding pad.

A method of programming or coding a mask-ROM is disclosed by Chiu, et al., in U.S. Pat. No. 5,538,914. The method includes forming gate oxide over the substrate between field oxide (FOX) regions; forming a control gate layer over the gate oxide; forming a gate mask over the device with and patterning a gate electrode and the gate oxide layer by etching through mask openings. Next, a lightly doped drain (LDD) mask is formed over the device exposing the gate. A P type dopant of a first dosage level is implanted through mask openings forming reverse type LDD implant doped P type regions. Spacers are next formed adjacent to the electrode over the substrate. An ion implant of N type dopant of a second dosage level is performed through the opening in the mask and aside from the spacers and the electrode into exposed portions of the substrate. The N type doped regions are self-aligned with the spacers and the gate and they provide a second dosage level in the substrate, the second dosage level being substantially different from the first dosage level.

Another method of forming a mask ROM is disclosed by Wu in U.S. Pat. No. 6,133,101. The method includes performing a blanket ion implantation to form regions LDD regions adjacent to gate structures. A second ion implantation is performed with tilted angle to form p channel punchthrough stopping regions. A third ion implantation is used to implant ions into a NMOS device region. Oxide spacers are then formed on gate structures. Next, a fourth ion implantation is then carried out to dope ions into the substrate to form source and drain regions in the NMOS region and a NMOS cell region, respectively. Next, a fifth ion implantation is used to dope dopant into a PMOS device region, thereby forming source and drain regions in the PMOS device region. Subsequently, a high temperature thermal anneal is performed to form shallow junction of the devices.

A different laminated gate mask ROM is shown in U.S. Pat. No. 6,087,699 by Wann, et al. A substrate is covered with a gate oxide layer between FOX regions with a blanket lower lamina for a gate on the surface. A mask-code mask has a window overlying the desired gate location. A doped code implant region is formed in the substrate by ion implanting code implant dopant through the mask. Following mask removal a blanket upper lamina of the gate covers the lower lamina. A gate mask covers the upper and lower laminae. The gate mask is patterned to protect the gate region over the device, leaving the remainder of the upper and lower lamina exposed. Exposed surfaces of the laminae are etched away leaving a laminated gate. LDD regions are formed in the substrate between the FOX regions and the gate by ion implanting dopant through portions of the gate oxide layer unprotected by the gate; forming spacers next to the gate; and forming source and drain regions in the substrate between the FOX regions and the spacers adjacent to the gate.

In U.S. Pat. No. 5,940,710 to Chung, et al., on the other hand, Chung et al teach a method for fabricating a metal oxide semiconductor field effect transistor (MOSFET) wherein source/drain junctions are formed by depositing and etching an oxide film having a desired thickness prior to the formation of a pocket region carried out by a pocket ion implantation after forming a gate oxide film and gate electrode on a channel region formed by implanting impurity ions in a silicon substrate. The pocket region is formed by impurity ions in source/drain regions exposed by etching the oxide film. Accordingly, it is possible to reduce the thermal budget applied to the source/drain junctions. As a result, the lateral diffusion of the impurity ions implanted in the source/drain junctions is sup-pressed yielding a channel longer than previously possible. Accordingly, the transistor achieves a highly compact or densely integrated size.

Still another memory device with multiple and orthogonally disposed conductors is disclosed in U.S. Pat. No. 5,480,822 by Hsue, et al. In accordance with this invention, a method of manufacture of a semiconductor memory device comprises the following steps: forming field oxide structures on a semiconductor substrate, forming a gate oxide layer on exposed surfaces of the substrate, forming a first word line layer on the device, patterning the first word line layer by forming a first patterned mask with a first set of openings therein and etching the first word line layer through the openings in the first mask to form conductor lines, forming a first dielectric layer on the surface of the first word line layer on the device, forming a second word line layer on the first dielectric layer, patterning the second word line layer by forming a second patterning mask with a second set of openings therein and etching portions of the second word line layer therethrough, forming a second dielectric layer on the surface of the second word line layer on the device, and implanting ions of dopant into predetermined locations into the semiconductor substrate of the device, the dopant being of sufficient concentration to form a doped region therein.

SUMMARY OF THE INVENTION

It is therefore an object of turning off a MOS transistor by performing an anti-code LDD implant.

It is another object of the present invention to provide a method of turning off a MOS transistor without high energy implant to cause any poly damage.

It is still another object of the present invention to provide a method of turning off a MOS transistor without being affected by the variation of the poly thickness.

It is yet another object of the present invention to provide a Flash-ROM process that is applicable to both polycide and silicide processes.

These objects are accomplished by providing a substrate having an NMOS region and a PMOS region; forming a dielectric layer over said substrate, including over said NMOS and PMOS regions; forming an NMOS gate electrode over said NMOS region and a PMOS gate electrode over said PMOS region over said dielectric layer formed over said NMOS and PMOS regions; forming a first cover layer over said PMOS region including over said PMOS gate electrode; performing an N-type lightly doped drain (NLDD) implant over uncovered said NMOS region using said NMOS gate electrode as a self-aligned mask; removing said first cover layer from over said PMOS region; forming a second cover layer over said NMOS region including over said NMOS gate electrode; performing P-type lightly doped drain (PLDD) implant over uncovered said PMOS region using said PMOS gate electrode as a self-aligned mask; removing said second cover layer from over said NMOS region; forming a third cover layer over said PMOS region including over said PMOS gate electrode; performing a code implant over uncovered said NMOS region using said NMOS gate electrode as a self-aligned mask; removing said third cover layer from over said PMOS region; forming a fourth cover layer over said NMOS region including over said NMOS gate electrode; performing a code implant over uncovered said PMOS region using said PMOS gate electrode as a self-aligned mask; removing said fourth cover layer from over said NMOS region; and performing a vertical and tilt angle anti-code LDD implant to turn off said MOS transistor.

BRIEF DESCRIPTION OF THE DRAWINGS

In the accompanying drawings, similar numerals refer to similar parts throughout the several views.

FIG. 1 is a partial cross-sectional view of a semiconductor substrate showing the forming of a conventional ROM device, according to prior art.

FIG. 2a is a partial cross-sectional view of a semiconductor substrate having an NMOS region and a PMOS region showing the NLDD implanting of the NMOS region, according to the present invention.

DESCRIPTION OF THE PREFERRED EMBODIMENTS

Figure 2B:
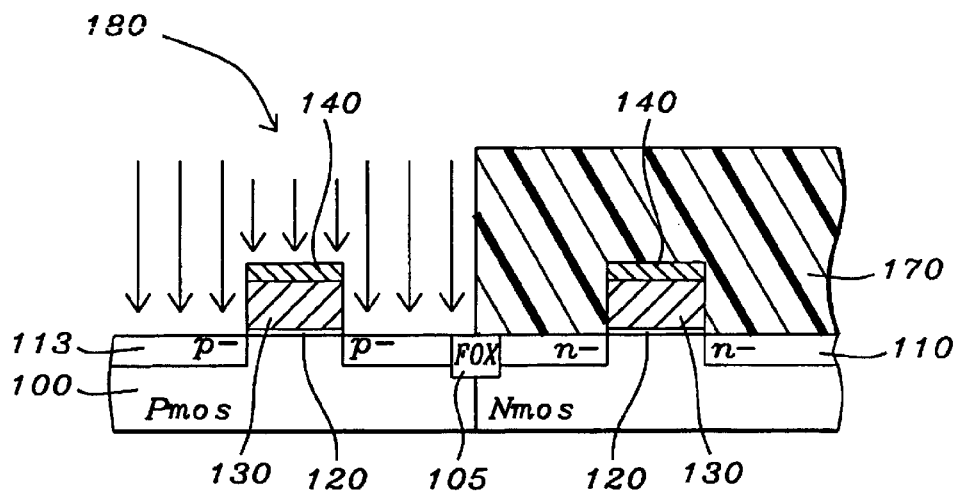
FIG. 2b is a partial cross-sectional view of a semiconductor substrate having an NMOS region and a PMOS region showing the PLDD implanting of the PMOS region, according to the present invention.
Figure 2C:
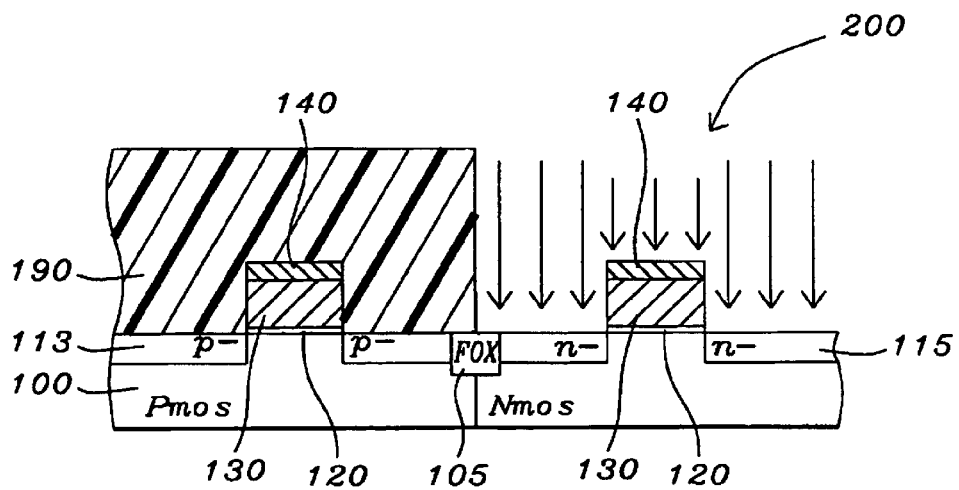
FIG. 2c is a partial cross-sectional view of a semiconductor substrate having an NMOS region and a PMOS region showing the code implanting of the NMOS region, according to the present invention.
Figure 2D:
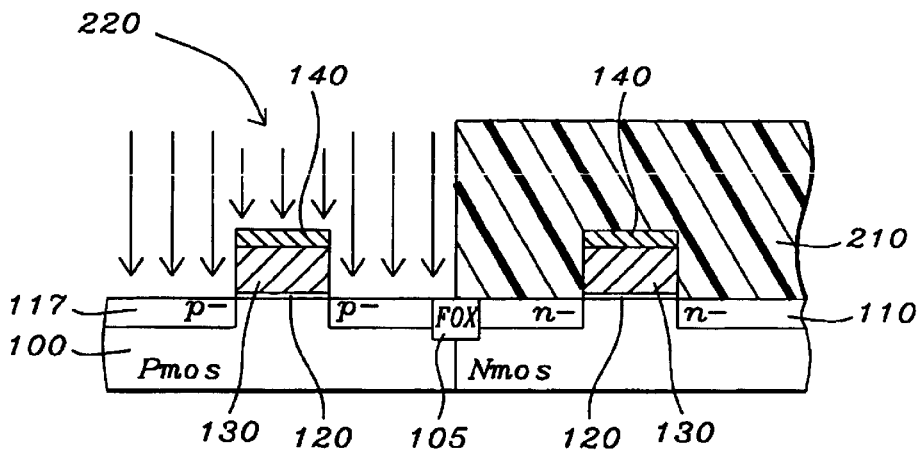
FIG. 2d is a partial cross-sectional view of a semiconductor substrate having an NMOS region and a PMOS region showing the code implanting of the PMOS region, according to the present invention.

Referring now to the drawings, FIGS. 2a–2h, there is shown a method of using anti-code type dosage of ions as a lightly doped drain, LDD, implant in turning off MOS devices without any poly gate damage in a masked read only memory ROM. Accordingly, it is shown that it is possible to eliminate the conventional code-photolithography and code implanting process and reduce the build cycle time—except for the N-type LDD and P-type LDD masks for each special code—by eliminating the need for implanting through conventional sacrificial oxide, which is too long.

As is known in the art, a coded device is defined "normally-off" when the LDD is implanted by reverse type, that is, by anti-code type dopant, to increase the threshold voltage $V_t$. For example, for a device of 20 $\mu$m width and 0.9 $\mu$m length, an NMOS's $V_t$ can reach more than 5 volts with a PLDD implant.

In FIG. 2a, substrate (100), preferably silicon, is provided with an NMOS well region and a PMOS well region. The P-well and N-well are separated by a thick oxide field (FOX) as referenced by numeral (105) in FIG. 2a. The most commonly used field oxide is formed by the method of Local Oxidation of Silicon (LOCOS) in which silicon nitride ($Si_3N_4$) layer (not shown) is deposited and patterned leaving portions over device regions. The substrate is then subjected to thermal oxidation to oxidize the exposed surface of the silicon substrate to form field oxide (105).

A layer of dielectric is formed over the substrate, including over both NMOS and PMOS regions, which is to serve as gate oxide layer (120) as shown in the same Figure. The oxide layer is preferably grown thermally in dry oxygen in an oxidation furnace at temperature range between about 800 to 1000° C. Alternatively, other oxidation methods can be used, such as oxidation in a dry oxygen and anhydrous hydrogen chloride in atmospheric or low pressure environment, or low temperature, high-pressure, and the like.

The formation of the gate oxide layer is followed by the forming of a polysilicon, or poly, layer, which is formed as a gate electrode following known methods. Poly gate electrode (130) is then deposited with a layer of tetraethyl orthosilicate (TEOS) having a thickness between about 750 to 850 Å, and silicided with tungsten $WSi_x$ having a thickness between about 1000 to 1500 Å. Alternatively, the poly gate can be a polycide comprising polysilicon having a thickness between about 1400 to 1600 and tungsten silicide having a thickness between about 1200 to 1300 Å. The silicided layer over the gate electrode is referenced by numeral (140) in FIG. 2a.

Next, a first cover layer, namely photoresist layer (150), is formed to cover only the PMOS region, including over the gate electrode over the PMOS region, namely, over the PMOS gate electrode. Then, the uncovered NMOS region is subjected to an N-type lightly doped drain (NLDD) implant (160) using arsenic (As) ions at a dosage level between about $4\times10^{13}$ to $6\times10^{13}$ atoms/cm$^3$ and at an energy level between about 40 to 60 KeV. This forms N- drains (110) shown in FIG. 2a. Afterwards, the first cover, or, photoresist layer (150) is removed, preferably using oxygen plasma ashing technique.

Then, a second cover layer, namely second photoresist layer (170), is formed to cover only the NMOS region, including over the gate electrode over the NMOS region, namely, over the NMOS gate electrode. Then, the uncovered PMOS region is subjected to an P-type lightly doped drain (PLDD) implant (180) using $BF_2$ ions at a dosage level between about $1.5\times10^{13}$ to $2.0\times10^{13}$ atoms/cm$^3$ and at an energy level between about 20 to 40 KeV. This forms P-drains (113) shown in FIG. 2b. The second cover, or, photoresist layer (170) is then removed.

At the next step, NMOS code implant is implemented. That is, a third cover layer, namely photoresist layer (190), is formed to cover only the PMOS region, including over the PMOS gate electrode. Then, the uncovered NMOS region is subjected to an anti-type code implant (200) using $BF_2$ ions at a dosage level between about $9\times10^{13}$ to $1\times10^{14}$ atoms/cm$^3$ and at an energy level between about 35 to 45 KeV. This forms drains (115) shown in FIG. 2c. Subsequently, third photoresist layer (190) is removed as before.

Similarly, a PMOS anti-type code implant is performed by forming fourth cover layer (210) to cover only the NMOS region, including over the NMOS gate electrode. Then, the uncovered PMOS region is subjected to a code implant (220) using phosphorous (P) ions at a dosage level between about $6\times10^{13}$ to $9\times10^{13}$ atoms/cm$^3$ and at an energy level between about 25 to 35 KeV. This forms drains (117) shown in FIG. 2d. Subsequently, fourth photoresist layer (190) is removed as before.

Figures 2E, 2F:
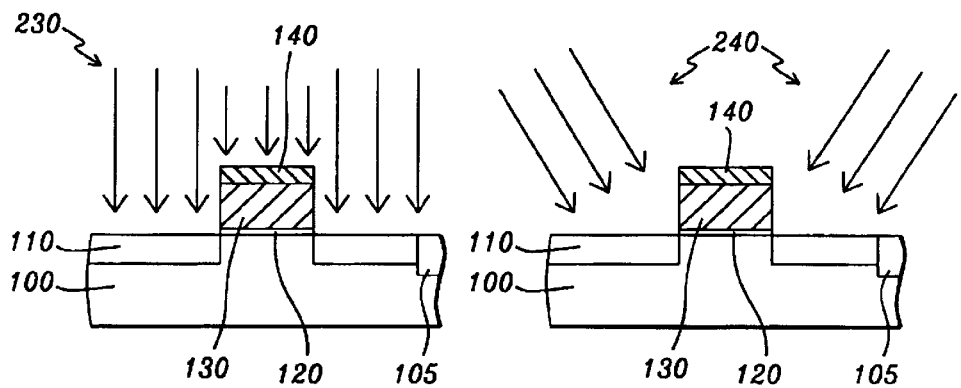
FIG. 2e is a partial cross-sectional view of a semiconductor substrate showing the turning off of the MOS transistor of this invention through a vertical implanting of anti-code ions, according to the present invention.
FIG. 2f is a partial cross-sectional view of a semiconductor substrate showing the turning off of the MOS transistor of this invention through a tilt-angled implanting of anti-code ions, according to the present invention.

At the next step, and as a main feature and key aspect of the present invention, a reverse, that is, an anti-type, or anti-code implant is performed to turn off the MOS transistors of the masked-ROM shown in FIG. 2e. This is accomplished by implanting $BF_2$ ions vertically at a dosage level between about $4\times10^{13}$ to $5\times10^3$ atoms/cm$^3$ and at an energy level between about 35 to 45 KeV. The vertical, or straight down implant is depicted schematically in FIG. 2e. In a second embodiment, the anti-code is implemented at a tilt angle between about 40 to 45 degrees as depicted in FIG. 2f. Finally, FIG. 2g shows a third embodiment where the anti-code implanting is performed both vertically and at a tilt angle.

As noted before, a coded device is defined "normally-off" when the LDD is implanted by reverse type, that is, by anti-code type dopant, to increase the threshold voltage $V_t$. It will now be apparent to those skilled in the art that the important factor is the degree to which the threshold voltage is increased as a trade off between the breakdown voltage and the ability to turn off the MOS transistor.

Figures 2G, 2H:
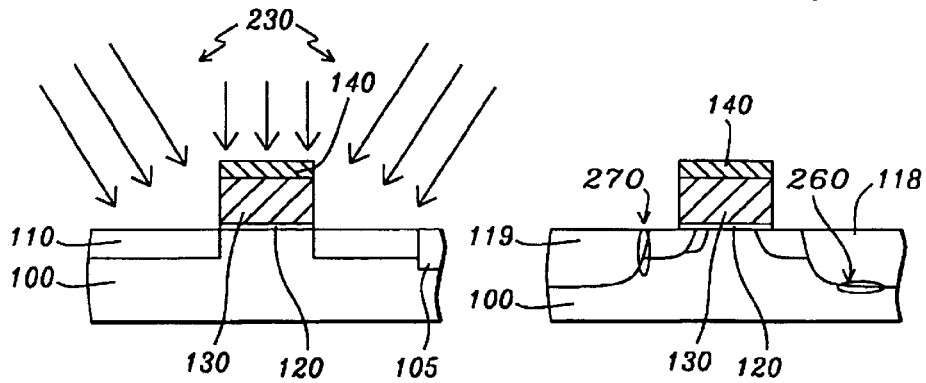
FIG. 2g is a partial cross-sectional view of a semiconductor substrate showing the turning off of the MOS transistor of this invention through a vertical and a tilt-angled implanting of anti-code ions, according to the present invention.
FIG. 2h is a partial cross-sectional view of a semiconductor substrate showing the increase in the critical breakdown voltage of the masked-ROM of this invention as a result of the disclosed anti-code implanting, according to the present invention.

FIG. 2h shows schematically how the normal junction break-down region (260) in a normal NMOS implant distribution is shifted upwards when anti-code implant is performed with a combination of verticality and tilt angle.

While the invention has been particularly shown and described with reference to the preferred embodiments thereof, it will be understood by those skilled in the art that various changes in form and details may be made without departing from the spirit and scope of the invention.

What is claimed is:

1. A method of using anti-code dosage as LDD implant to turn off a MOS transistor comprising the steps of:

providing a substrate having an NMOS region and a PMOS region;

forming a dielectric layer over said substrate, including over said NMOS and PMOS regions;

forming an NMOS gate electrode over said NMOS region and a PMOS gate electrode over said PMOS region over said dielectric layer formed over said NMOS and PMOS regions;

forming a first cover layer over said PMOS region including over said PMOS gate electrode;

performing an N-type lightly doped drain (NLDD) implant over uncovered said NMOS region using said NMOS gate electrode as a self-aligned mask;

removing said first cover layer from over said PMOS region;

forming a second cover layer over said NMOS region including over said NMOS gate electrode;

performing P-type lightly doped drain (PLDD) implant over uncovered said PMOS region using said PMOS gate electrode as a self-aligned mask;

removing said second cover layer from over said NMOS region;

forming a third cover layer over said PMOS region including over said PMOS gate electrode;

performing a code implant over uncovered said NMOS region using said NMOS gate electrode as a self-aligned mask;

removing said third cover layer from over said PMOS region;

forming a fourth cover layer over said NMOS region including over said NMOS gate electrode;

performing a code implant over uncovered said PMOS region using said PMOS gate electrode as a self-aligned mask;

removing said fourth cover layer from over said NMOS region; and performing a vertical anti-code LDD implant to turn off said MOS transistor.

2. The method according to claim 1, wherein said substrate is silicon.

3. The method according to claim 1, wherein said dielectric layer is a gate oxide layer having a thickness between about 100 to 150 angstroms (Å).

4. The method according to claim 1, wherein said NMOS and PMOS gate electrodes comprise a polysilicon layer having a thickness between about 1400 to 1600 Å, a tetraethyl orthosilicate (TEOS) layer having a thickness between about 750 to 850 Å, and a tungsten silicide layer having a thickness between about 1000 to 1500 Å.

5. The method according to claim 1, wherein said NMOS and PMOS gate electrodes comprise polycide which further comprises polysilicon having a thickness between about 1400 to 1600 Å and tungsten silicide having a thickness between about 1200 to 1300 Å.

6. The method according to claim 1, wherein said first cover layer is photoresist having a thickness between about 1.0 to 1.2 micrometers ($\mu$m).

7. The method according to claim 1, wherein said performing said NLLD implant over uncovered said NMOS region is accomplished with As ions at a dosage level between about $4 \times 10^{13}$ to $6 \times 10^{13}$ atoms/cm3 and at an energy level between about 40 to 60 KeV.

8. The method according to claim 1 or 6, wherein said removing said first cover layer is accomplished by oxygen plasma ashing.

9. The method according to claim 1, wherein said performing said PLLD implant over uncovered said PMOS region is accomplished with BF2 ions at a dosage level between about $1.5 \times 10^{13}$ to $2.0 \times 10^{13}$ atoms/cm3 and at an energy level between about 20 to 40 KeV.

10. The method according to claim 1, wherein said performing said code implant over uncovered said NMOS region is accomplished with BF2 ions at a dosage level between about $9 \times 10^{13}$ to $1 \times 10^{14}$ atoms/cm3 and at an energy level between about 35 to 45 KeV.

11. The method according to claim 1, wherein said performing said code implant over uncovered said PMOS region is accomplished with P ions at a dosage level between about $6 \times 10^{13}$ to $9 \times 10^{13}$ atoms/cm3 and at an energy level between about 25 to 35 KeV.

12. The method according to claim 1, wherein said performing said vertical anti-code dosage is accomplished with BF2 ions at a dosage level between about $4.0 \times 10^{13}$ to $5.0 \times 10^{13}$ atoms/cm3 and at an energy level between about 35 to 45 KeV.

13. A method of using anti-code dosage as LDD implant to turn off a MOS transistor comprising the steps of:

providing a substrate having an NMOS region and a PMOS region;

forming a dielectric layer over said substrate, including over said NMOS and PMOS regions;

forming an NMOS gate electrode over said NMOS region and a PMOS gate electrode over said PMOS region over said dielectric layer formed over said NMOS and PMOS regions;

forming a first cover layer over said PMOS region including over said PMOS gate electrode;

performing an N-type lightly doped drain (NLDD) implant over uncovered said NMOS region using said NMOS gate electrode as a self-aligned mask;

removing said first cover layer from over said PMOS region;

forming a second cover layer over said NMOS region including over said NMOS gate electrode;

performing P-type lightly doped drain (PLDD) implant over uncovered said PMOS region using said PMOS gate electrode as a self-aligned mask;

removing said second cover layer from over said NMOS region;

forming a third cover layer over said PMOS region including over said PMOS gate electrode;

performing a code implant over uncovered said NMOS region using said NMOS gate electrode as a self-aligned mask;

removing said third cover layer from over said PMOS region; forming a fourth cover layer over said NMOS region including over said NMOS gate electrode;

performing a code implant over uncovered said PMOS region using said PMOS gate electrode as a self-aligned mask;

removing said fourth cover layer from over said NMOS region; and performing a tilt angle anti-code LDD implant to turn off said MOS transistor.

14. The method according to claim 13, wherein said substrate is silicon.

15. The method according to claim 13, wherein said dielectric layer is a gate oxide layer having a thickness between about 10 to 150 angstroms (Å).

16. The method according to claim 13, wherein said NMOS and PMOS gate electrodes comprise a polysilicon layer having a thickness between about 1400 to 1600 Å, a tetraethyl orthosilicate (TEOS) layer having a thickness between about 750 to 850 Å, and a tungsten silicide layer having a thickness between about 1000 to 1500 Å.

17. The method according to claim 13, wherein said NMOS and PMOS gate electrodes comprise polycide which further comprises polysilicon having a thickness between about 1400 to 1600 Å and tungsten silicide having a thickness between about 1200 to 1300 Å.

18. The method according to claim 13, wherein said first cover layer is photoresist having a thickness between about 1.0 to 1.2 micrometers ($\mu$m).

19. The method according to claim 13, wherein said performing said NLLD implant over uncovered said NMOS region is accomplished with As ions at a dosage level between about $4 \times 10^{13}$ to $6 \times 10^{13}$ atoms/cm3 and at an energy level between about 40 to 60 KeV.

20. The method according to claim 13 or 18, wherein said removing said first cover layer is accomplished by oxygen plasma ashing.

21. The method according to claim 13, wherein said performing said PLLD implant over uncovered said PMOS region is accomplished with BF2 ions at a dosage level between about 1.5×1013 to 2.0×1013 atoms/cm3 and at an energy level between about 20 to 40 KeV.

22. The method according to claim 13, wherein said performing said code implant over uncovered said NMOS region is accomplished with BF2 ions at a dosage level between about 9×1013 to 1×1014 atoms/cm3 and at an energy level between about 35 to 45 KeV.

23. The method according to claim 13, wherein said performing said code implant over uncovered said PMOS region is accomplished with P ions at a dosage level between about 6×1013 to 9×1013 atoms/cm3 and at an energy level between about 25 to 35 KeV.

24. The method according to claim 13, wherein said performing said tilt angle anti-code LDD implant is accomplished with BF2 ions at a dosage level between about 4.0×1013 to 5.0×1013 atoms/cm3 and at an energy level between about 35 to 45 KeV, and at a tilt angle between about 40 to 45 degrees.

25. A method of using anti-code dosage as LDD implant to turn off a MOS transistor comprising the steps of:
providing a substrate having an NMOS region and a PMOS region;
forming a dielectric layer over said substrate, including over said NMOS and PMOS regions;
forming an NMOS gate electrode over said NMOS region and a PMOS gate electrode over said PMOS region over said dielectric layer formed over said NMOS and PMOS regions;
forming a first cover layer over said PMOS region including over said PMOS gate electrode;
performing an N-type lightly doped drain (NLDD) implant over uncovered said NMOS region using said NMOS gate electrode as a self-aligned mask;
removing said first cover layer from over said PMOS region;
forming a second cover layer over said NMOS region including over said NMOS gate electrode;
performing P-type lightly doped drain (PLDD) implant over uncovered said PMOS region using said PMOS gate electrode as a self-aligned mask;
removing said second cover layer from over said NMOS region;
forming a third cover layer over said PMOS region including over said PMOS gate electrode;
performing a code implant over uncovered said NMOS region using said NMOS gate electrode as a self-aligned mask;
removing said third cover layer from over said PMOS region;
forming a fourth cover layer over said NMOS region including over said NMOS gate electrode;
performing a code implant over uncovered said PMOS region using said PMOS gate electrode as a self-aligned mask;
removing said fourth cover layer from over said NMOS region; and
performing a vertical and tilt angle anti-code LDD implant to turn off said MOS transistor.

26. The method according to claim 25, wherein said substrate is silicon.

27. The method according to claim 25, wherein said dielectric layer is a gate oxide layer having a thickness between about 100 to 150 angstroms (Å).

28. The method according to claim 25, wherein said NMOS and PMOS gate electrodes comprise a polysilicon layer having a thickness between about 1400 to 1600 Å, a tetraethyl orthosilicate (TEOS) layer having a thickness between about 750 to 850 Å, and a tungsten silicide layer having a thickness between about 1000 to 1500 Å.

29. The method according to claim 25, wherein said NMOS and PMOS gate electrodes comprise polycide which further comprises polysilicon having a thickness between about 1400 to 1600 Å and tungsten silicide having a thickness between about 1200 to 1300 Å.

30. The method according to claim 25, wherein said first cover layer is photoresist having a thickness between about 1.0 to 1.2 micrometers ($\mu$m).

31. The method according to claim 25, wherein said performing said NLLD implant over uncovered said NMOS region is accomplished with As ions at a dosage level between about 4×1013 to 6×1013 atoms/cm3 and at an energy level between about 40 to 60 KeV.

32. The method according to claim 25 or 30, wherein said removing said first cover layer is accomplished by oxygen plasma ashing.

33. The method according to claim 25, wherein said performing said PLLD implant over uncovered said PMOS region is accomplished with BF2 ions at a dosage level between about 1.5×1013 to 2.0×1013 atoms/cm3 and at an energy level between about 20 to 40 KeV.

34. The method according to claim 25, wherein said performing said code implant over uncovered said NMOS region is accomplished with BF2 ions at a dosage level between about 9×1013 to 1×1014 atoms/cm3 and at an energy level between about 35 to 45 KeV.

35. The method according to claim 25, wherein said performing said code implant over uncovered said PMOS region is accomplished with phosphorous (P) ions at a dosage level between about 6×1013 to 9×1013 atoms/cm3 and at an energy level between about 25 to 35 KeV.

36. The method according to claim 25, wherein said performing said vertical and tilt angle anti-code LDD implant is accomplished with BF2 ions at a dosage level between about 4.0×1013 to 5.0×1013 atoms/cm3 and at an energy level between about 35 to 45 KeV, and at a tilt angle between about 40 to 45 degrees.

* * * * *